United States Patent
Takeuchi et al.

(10) Patent No.: US 12,269,943 B2
(45) Date of Patent: Apr. 8, 2025

(54) LIQUID RESIN COMPOSITION FOR SEALING AND ELECTRONIC COMPONENT DEVICE

(71) Applicant: HITACHI CHEMICAL COMPANY, LTD., Tokyo (JP)

(72) Inventors: Yuma Takeuchi, Tokyo (JP); Hisato Takahashi, Tokyo (JP); Hiroyoshi Deguchi, Tokyo (JP)

(73) Assignee: RESONAC CORPORATION, Tokyo (JP)

( * ) Notice: Subject to any disclaimer, the term of this patent is extended or adjusted under 35 U.S.C. 154(b) by 0 days.

(21) Appl. No.: 16/300,101

(22) PCT Filed: May 11, 2016

(86) PCT No.: PCT/JP2016/064053
§ 371 (c)(1),
(2) Date: Nov. 9, 2018

(87) PCT Pub. No.: WO2017/195304
PCT Pub. Date: Nov. 16, 2017

(65) Prior Publication Data
US 2019/0144660 A1 May 16, 2019

(51) Int. Cl.
| | |
|---|---|
| C08L 63/00 | (2006.01) |
| C08G 59/50 | (2006.01) |
| H01L 23/29 | (2006.01) |
| H01L 23/31 | (2006.01) |
| C08L 53/00 | (2006.01) |
| C08L 67/02 | (2006.01) |

(52) U.S. Cl.
CPC .............. *C08L 63/00* (2013.01); *C08G 59/50* (2013.01); *C08G 59/5033* (2013.01); *H01L 23/29* (2013.01); *H01L 23/31* (2013.01); *C08L 53/00* (2013.01); *C08L 67/02* (2013.01); *C08L 2203/20* (2013.01)

(58) Field of Classification Search
None
See application file for complete search history.

(56) References Cited

U.S. PATENT DOCUMENTS

| | | | | |
|---|---|---|---|---|
| 2002/0076539 A1* | 6/2002 | Nakamura | ........... | H05K 3/4661 428/209 |
| 2003/0134976 A1* | 7/2003 | Metcalfe | ............ | C08L 2666/02 525/88 |
| 2004/0099367 A1* | 5/2004 | Nakamura | ........... | H05K 3/4661 156/182 |
| 2005/0005437 A1* | 1/2005 | Nakamura | ........... | H05K 3/4673 29/846 |
| 2013/0131216 A1* | 5/2013 | Sakane | ................ | C09D 163/00 523/451 |
| 2015/0064847 A1* | 3/2015 | Wakioka | ........... | H01L 21/76841 523/427 |
| 2016/0040045 A1* | 2/2016 | Morita | .................... | C08L 61/00 524/561 |

FOREIGN PATENT DOCUMENTS

| | | |
|---|---|---|
| JP | S56-082814 A | 7/1981 |
| JP | H01-159665 A | 6/1989 |
| JP | H03-006280 A | 1/1991 |
| JP | 2000-178342 A | 6/2000 |
| JP | 2001-109254 A | 4/2001 |
| JP | 2002-003699 A | 1/2002 |
| JP | 2002-363251 A | 12/2002 |
| JP | 2006-316234 A | 11/2006 |
| JP | 2010-010669 A | 1/2010 |
| JP | 2010-254955 A | 11/2010 |
| JP | 2011-006618 A | 1/2011 |
| JP | 2011-046928 A | 3/2011 |
| JP | 2013-008896 A | 1/2013 |
| JP | 2013-028659 A | 2/2013 |
| JP | 2013-163747 A | 8/2013 |
| JP | 2013-256547 A | 12/2013 |
| JP | 2014-221922 A | 11/2014 |
| JP | 2015-083634 A | 4/2015 |
| JP | 2015-189847 A | 11/2015 |
| JP | 2016-069519 A | 5/2016 |
| JP | 2016-113525 A | 6/2016 |
| JP | 6835076 B2 | 2/2021 |
| KR | 2003-0014374 A | 2/2003 |
| TW | 201224049 A | 6/2012 |
| TW | 201239056 A1 | 10/2012 |
| WO | 2013/125086 A1 | 8/2013 |

* cited by examiner

*Primary Examiner* — Megan McCulley
(74) *Attorney, Agent, or Firm* — FITCH, EVEN, TABIN & FLANNERY, LLP

(57) ABSTRACT

A liquid resin composition for sealing contains an epoxy resin (A); a curing agent (B) containing at least one amino group in a molecule; a polymer resin (C); and an inorganic filler (D), wherein the polymer resin (C) has a weight average molecular weight of 10,000 or more.

19 Claims, No Drawings

LIQUID RESIN COMPOSITION FOR SEALING AND ELECTRONIC COMPONENT DEVICE

CROSS-REFERENCE TO RELATED APPLICATIONS

This application is a U.S. national phase application filed under 35 U.S.C. § 371 of International Application No. PCT/JP2016/064053, filed May 11, 2016, which is hereby incorporated herein by reference in its entirety.

TECHNICAL FIELD

The present invention relates to a liquid resin composition for sealing and an electronic component device.

BACKGROUND ART

In recent years, there is a demand for high integration as a trend of electronic component devices such as semiconductor chips. For example, a flip chip package, in which a substrate is joined with a chip via solder bumps, is used for semiconductor modules in many cases.

Such semiconductor modules are mounted on, for example, small mobile devices such as mobile phones and smart phones, and the demand for semiconductor modules has been increasing in the market year by year. In order to ensure insulation performance of a flip chip package, an underfill is used as a sealing material. As an underfill is fluid at room temperature, sealing of a package is achieved by a method of filling a gap between a chip and a substrate with an underfill by a capillary phenomenon and then curing the underfill.

In the manufacturing process of a semiconductor module, when an uncured underfill is cured, bleed-out that is a phenomenon in which a liquid component contained in the underfill flows out from the underfill occurs in some cases. Once the bleed-out phenomenon occurs, a liquid component that has flown out from an underfill contaminates the wiring on a semiconductor substrate, which could result in reduction of reliability, bonding performance, and the like of a semiconductor module.

To solve the issue of the occurrence of the bleed-out phenomenon, for example, Japanese Patent Application Laid-Open (JP-A) No. 2000-178342 discloses an insulation paste for bonding a semiconductor module, which contains an epoxy compound having a number average molecular weight of from 600 to 1000. According to this insulation paste, the bleed-out phenomenon is eliminated upon manufacturing a semiconductor module, which is described in JP-A No. 2000-178342.

SUMMARY OF INVENTION

Technical Problem

Meanwhile, in recent years, there is an increasing demand for downsizing of semiconductor chips, and therefore, the distance between a semiconductor chip and the wiring arranged around a semiconductor chip has become dense. Such a downsized semiconductor chip is required to have ability to prevent the bleed-out phenomenon in a strict manner as well as to have favorable formability. However, the insulation paste disclosed in JP-A No. 2000-178342 rather fails to sufficiently prevent the bleed-out phenomenon and maintain high fluidity even when applied to a recent downsized semiconductor module. There is a demand for a resin composition capable of suppressing the occurrence of the bleed-out phenomenon while maintaining fluidity.

The bleed-out phenomenon occurs when a liquid component flows out on the surface of a solder resist substrate that is applied to a semiconductor module, and the degree of flow-out of a liquid component in the bleed-out phenomenon also depends on type of the substrate. In particular, in a case in which the surface of a substrate is plasma-treated, the bleed-out phenomenon is likely to occur. Since plasma treatment is used for washing the interface of a semiconductor module in a step prior to sealing the semiconductor module, it is often unavoidable to conduct plasma treatment upon semiconductor module production.

The invention has been made in view of the above problems. An object of the invention is to provide a liquid resin composition for sealing capable of maintaining high fluidity and heat resistance and suppressing the occurrence of the bleed-out phenomenon and an electronic component device using the same.

Solution to Problem

Concrete means for achieving the above-described object are as follows.

<1> A liquid resin composition for sealing, comprising: an epoxy resin (A); a curing agent (B) containing at least one amino group in a molecule; a polymer resin (C); and an inorganic filler (D), wherein the polymer resin (C) has a weight average molecular weight of 10,000 or more.

<2> The liquid resin composition for sealing according to <1>, wherein the polymer resin (C) has an SP (cal/cm$^3$)$^{0.5}$ value, determined by the Fedors method, of from 9.0 to 12.5.

<3> The liquid resin composition for sealing according to <1> or <2>, wherein the content of the polymer resin (C) is from 0.05% by mass to 5.0% by mass with respect to the total solid content.

<4> The liquid resin composition for sealing according to any one of <1> to <3>, wherein the epoxy resin (A) includes an epoxy resin that assumes a liquid state at 25° C.

<5> The liquid resin composition for sealing according to any one of <1> to <4>, wherein the polymer resin (C) has a methacrylic acid ester structure, a polyester structure, or a phenoxy structure.

<6> The liquid resin composition for sealing according to <5>, wherein the polymer resin (C) having the methacrylic acid ester structure comprises a block copolymer of methyl methacrylate and butyl acrylate.

<7> The liquid resin composition for sealing according to <5>, wherein the polymer resin (C) having the polyester structure comprises polyester polyol.

<8> The liquid resin composition for sealing according to <5>, wherein the polymer resin (C) having the phenoxy structure comprises a bisphenol A type epoxy resin, a bisphenol F type epoxy resin, or a copolymerized epoxy resin of bisphenol A and bisphenol F, which has an epoxy equivalent weight of 3,000 g/eq or more.

<9> An electronic component device, comprising:
a substrate having a circuit layer;
an element which is disposed on the substrate and electrically connected to the circuit layer; and
a cured product of the liquid resin composition for sealing according to any one of <1> to <8>, which is filled into a gap between the substrate and the element.

<10> A liquid resin composition for sealing, comprising: an epoxy resin (A); a curing agent (B) containing at least one amino group in a molecule; a polymer resin (C); and an inorganic filler (D), wherein the polymer resin (C) has an SP $(cal/cm^3)^{0.5}$ value, determined by the Fedors method, of from 9.0 to 12.5.

Advantageous Effects of Invention

According to the invention, it is possible to provide a liquid resin composition for sealing capable of maintaining high fluidity and heat resistance and suppressing the occurrence of the bleed-out phenomenon and an electronic component device using the same.

DESCRIPTION OF EMBODIMENTS

Hereinafter, embodiments for carrying out the liquid resin composition for sealing and the electronic component device of the invention will be described in detail. It is noted here, however, that the invention is not restricted to the below-described embodiments. In the below-described embodiments, the constituents thereof (including element steps and the like) are not indispensable unless otherwise specified. The same applies to the numerical values and ranges thereof, without restricting the invention.

In the present specification, the term "step" encompasses not only steps discrete from other steps but also steps which cannot be clearly distinguished from other steps, as long as the intended purpose of the step is achieved.

In the present specification, those numerical ranges that are expressed with "to" each denote a range that includes the numerical values stated before and after "to" as the minimum value and the maximum value, respectively.

In a set of numerical ranges that are stated stepwise in the present specification, the upper limit value or the lower limit value of a numerical range may be replaced with the upper limit value or the lower limit value of other numerical range. Further, in a numerical range stated in the present specification, the upper limit or the lower limit of the numerical range may be replaced with a relevant value indicated in any of Examples.

In the present specification, when there are plural kinds of substances that correspond to a component of a composition, the indicated content of the component in the composition means, unless otherwise specified, the total content of the plural kinds of substances existing in the composition.

In the present specification, when there are plural kinds of particles that correspond to a component of a composition, the indicated particle size of the component in the composition means, unless otherwise specified, a value determined for a mixture of the plural kinds of particles existing in the composition.

In the present specification, the term "layer" includes, when observing a region where a layer is present, a case in which the layer is formed only on a part of the region in addition to a case in which the layer is formed on the entirety of the region.

[Liquid Resin Composition for Sealing]

A liquid resin composition for sealing in a first embodiment includes an epoxy resin (A); a curing agent (B) containing at least one amino group in a molecule (hereinafter also referred to as a "particular curing agent (B)"); a polymer resin (C); and an inorganic filler (D). The polymer resin (C) has a weight average molecular weight of 10,000 or more.

In addition, a liquid resin composition for sealing in a second embodiment includes an epoxy resin (A); a curing agent (B) containing at least one amino group in a molecule; a polymer resin (C); and an inorganic filler (D). The polymer resin (C) has an SP $(cal/cm^3)^{0.5}$ value, determined by the Fedors method, of from 9.0 to 12.5.

Hereinafter, the liquid resin composition for sealing in the first embodiment and the liquid resin composition for sealing in the second embodiment are collectively referred to as the "liquid resin composition for sealing in this embodiment" or each of them is simply referred to as a "liquid resin composition for sealing."

As a result of intensive studies in order to achieve the above object, the inventors found that it is possible to obtain a liquid resin composition for sealing capable of maintaining high fluidity and heat resistance and suppressing the occurrence of the bleed-out phenomenon by allowing a liquid resin composition for sealing to contain a polymer resin having a weight average molecular weight of 10,000 or more or a polymer resin having an SP value of from 9.0 to 12.5. This has led to the completion of the invention.

The liquid resin composition for sealing in this embodiment can maintain high fluidity and heat resistance and suppress the occurrence of the bleed-out phenomenon. The reason therefor is unclear but can be assumed as described below.

A polymer resin (C) having a weight average molecular weight of 10,000 or more contained in the liquid resin composition for sealing in the first embodiment is compatible with a liquid component contained in the liquid resin composition for sealing. It is therefore considered that the liquid component can be prevented from flowing out on a solder resist substrate. It is considered that the polymer resin having a weight average molecular weight of 10,000 or more plays a role to allow the exertion of the effect of suppressing the bleed-out phenomenon.

It is also considered that since the liquid resin composition for sealing in this embodiment contains an epoxy resin (A) and a particular curing agent (B), a cured product of the liquid resin composition for sealing in this embodiment can obtain excellent heat resistance.

The inventors also found that as a polymer resin (C) having an SP value of from 9.0 to 12.5 contained in the liquid resin composition for sealing in the second embodiment has hydrophilicity (hydrophobicity) relatively similar to hydrophilicity (hydrophobicity) of the liquid component, there is a tendency that the occurrence of the bleed-out phenomenon can be suppressed.

Although the reason therefore is unclear, it is considered that when a liquid resin composition for sealing is allowed to contain a polymer resin (C) having hydrophilicity (hydrophobicity) relatively similar to hydrophilicity (hydrophobicity) of a liquid component, the polymer resin can be easily compatible with the liquid component in the liquid resin composition for sealing, thereby making it possible to prevent a portion of the liquid component to flow out on a solder resist substrate and to improve the effect of suppressing the bleed-out phenomenon.

In this embodiment, a solubility parameter (SP value) is used as an index representing hydrophilicity (hydrophobicity) of a component contained in a liquid resin composition for sealing. A component to be used in a liquid resin composition for sealing has an SP value of usually from about 8 to 14.

In a case in which each component of a liquid resin composition for sealing contains a combination of two or more kinds of materials, the SP value of each component is obtained based on a weighted average of the SP values of the materials used in combination. For example, a combination of an epoxy resin α and an epoxy resin β is used as an epoxy resin (A), the SP value of the epoxy resin (A) means the weighted average of the SP values of the epoxy resins α and β.

A technique for calculating an SP value in the present specification is described below.

An SP value can be calculated based on the Fedors method by the following equation: $\delta^2 = \Sigma E/\Sigma V$. Note that δ represents an SP value, E represents evaporation energy, V represents a molar volume (cited reference: R. T. Fedors, Polymer Engineering and Science, 14,147 (1974), Journal of the Adhesion Society of Japan, Vol. 22 No. 10 (1986)).

Hereinafter, each component of the liquid resin composition for sealing in this embodiment will be described in detail.

<Epoxy Resin (A)>

The liquid resin composition for sealing in this embodiment contains an epoxy resin (A).

An epoxy resin (A) imparts curing performance and adhesiveness to the liquid resin composition for sealing, and also imparts durability and heat resistance to a cured product of the liquid resin composition for sealing.

Examples of an epoxy resin (A) include, but are not particularly limited to, naphthalene type epoxy resins; diglycidyl ether type epoxy resins such as bisphenol A, bisphenol F, bisphenol AD, bisphenol S, and hydrogenated bisphenol A; epoxidized novolak resins obtained by reacting phenols and aldehydes represented by ortho-cresol novolak type epoxy resins; glycidyl ester type epoxy resins obtained by reacting epichlorohydrin and polybasic acids such as phthalic acid and dimer acid; glycidyl amine type epoxy resins obtained by reacting epichlorohydrin and amine compounds such as diamino diphenylmethane and isocyanuric acid.

From the viewpoint of adjustment of viscosity, the epoxy equivalent weight of an epoxy resin (A) is preferably from 80 g/eq to 250 g/eq, more preferably from 85 g/eq to 240 g/eq, and still more preferably from 90 g/eq to 230 g/eq.

A technique for determining an epoxy equivalent weight in the present specification is described below.

An epoxy resin is dissolved in methyl ethyl ketone. Glacial acetic acid, cetyl trimethyl ammonium bromide, and a screened indicator (prepared by mixing a solution in which 0.3 g of batten blue is dissolved in 100 mL of glacial acetic acid and a solution in which 1.5 g of thymol blue is dissolved in 500 mL of methanol) are added to the dissolved solution, and a perchloric acid solution adjusted to 0.1N is used for titration. A time point when the color of the solution turned pink and the pink color lasted one minute is determined to be an ending point. In addition, a blank test is performed to calculate an epoxy equivalent weight by the following equation.

Epoxy equivalent weight $(g/eq) = (1000 \times W)/\{(S-B) \times N\}$

W: Sample mass
B: Amount of 0.1N perchloric acid solution used for blank test
S: Amount of 0.1N perchloric acid solution used for titration of sample
N: Normality of perchloric acid solution (0.1N)

It is preferable that an epoxy resin (A) includes an epoxy resin that assumes a liquid state at 25° C. from the viewpoint of fluidity. In this embodiment, it is also possible to use an epoxy resin in a solid state at 25° C. in combination as long as such an epoxy resin does not influence fluidity of the liquid resin composition for sealing.

In this embodiment, when a component is in a liquid state at 25° C., this means that the component has a viscosity of 50 Pa·s or less at 25° C.

Since an epoxy resin that assumes a liquid state at 25° C. is included as an epoxy resin (A), fluidity of the liquid resin composition for sealing in this embodiment tends to improve.

Viscosity of an epoxy resin (A) at 25° C. is preferably from 0.01 Pa·s to 40 Pa·s and more preferably from 0.5 Pa·s to 30 Pa·s.

In the present specification, viscosity of an epoxy resin (A) at 25° C. means a value determined at 25° C. using an E type viscometer (cone angle: 3°, rotational speed: 10 $\min^{-1}$).

The weight average molecular weight of an epoxy resin (A) is not particularly limited. The weight average molecular weight of an epoxy resin (A) is preferably from 100 to 1,000, more preferably from 150 to 800, and still more preferably from 200 to 500.

A technique for determining a weight average molecular weight (Mw) and a number average molecular weight (Mn) in the present specification is described below.

The weight average molecular weight and the number average molecular weight are obtained by performing measurement by gel permeation chromatography (GPC) and converting measurement results using a calibration curve of standard polystyrene. GPC conditions are described below.

GPC Conditions
Pump: Hitachi L-6000 type (manufactured by Hitachi, Ltd.)
Columns: The following three columns in total
Gelpack GL-R420
Gelpack GL-R430
Gelpack GL-R440
(trade names, manufactured by Hitachi Chemical Co., Ltd.)
Eluent: Tetrahydrofuran
Measurement temperature: 25° C.
Flow rate: 2.05 mL/minute
Detector: Hitachi L-3300 type RI (manufactured by Hitachi, Ltd.)

The SP value of an epoxy resin (A) is preferably from 8 to 14, more preferably from 8.5 to 13, and still more preferably from 9 to 13.

Commercially available products may be used as an epoxy resin (A). Examples of commercially available products of an epoxy resin (A) include, but are not specifically limited to a bisphenol F type epoxy resin (trade name: YDF-8170C; SP value: 11.4) manufactured by NIPPON STEEL & SUMIKIN CHEMICAL CO., LTD., a bisphenol A type epoxy resin (trade name: YD-128; SP value: 10.9) manufactured by NIPPON STEEL & SUMIKIN CHEMICAL CO., LTD., an amine type epoxy resin (trade name: jER-630; SP value: 11.0) manufactured by Mitsubishi Chemical Corporation. Such epoxy resins (A) may be used singly, or in combination/mixture of two or more kinds thereof.

The content of an epoxy resin (A) is preferably from 5% by mass to 40% by mass, more preferably from 7% by mass to 35% by mass, and still more preferably from 10% by mass to 30% by mass with respect to the total solid content.

In this embodiment, the term "solid content" refers to a residue obtained by removing a volatile component from a liquid resin composition for sealing.

<Curing Agent Containing at Least One Amino Group in a Molecule (Particular Curing Agent) (B)>

The liquid resin composition for sealing in this embodiment contains a particular curing agent (B).

A particular curing agent (B) is not particularly limited as long as it can cause an epoxy resin (A) to be cured. A particular curing agent (B) that can be used may be in a liquid or solid state as long as when a particular curing agent (B) is mixed in a liquid resin composition for sealing, it allows the liquid resin composition for sealing to be fluid at 25° C.

Since a curing agent that assumes a liquid state at 25° C. is included as a particular curing agent (B), fluidity of the liquid resin composition for sealing in this embodiment tends to improve.

Examples of a particular curing agent (B) include chain aliphatic amines, cycloaliphatic amines, aliphatic aromatic amines, and aromatic amines. From the viewpoints of heat resistance and electrical properties, aromatic amines are preferable.

Specific examples of a particular curing agent (B) include: chain aliphatic amines such as diethylenetriamine, triethylenetetramine, tetraethylenepentamine, dipropylenediamine, diethylaminopropylamine, hexamethylenediamine, and 1,2-bis(2-aminoethoxy)ethane; cycloaliphatic amines such as N-aminoethylpiperazine, menthenediamine, isophoronediamine, diaminodicyclohexylmethane, and 1,3-diaminomethyl cyclohexane; aliphatic aromatic amines such as m-xylylenediamine; aromatic amines having one aromatic ring such as meta-phenylenediamine, 1,3-diaminotoluene, 1,4-diaminotoluene, 2,4-diaminotoluene, 3,5-diethyl-2,4-diaminotoluene, 3,5-diethyl-2,6-diaminotoluene, and 2,4-diaminoanisole; aromatic amines having two aromatic rings such as 2,4'-diaminodiphenylmethane, 4,4'-diaminodiphenylsulfone, 4,4'-methylenebis(2-ethylaniline), 3,3'-diethyl-4,4'-diaminodiphenylmethane, 3,3',5,5'-tetramethyl-4,4'-diaminodiphenylmethane, 3,3',5,5'-tetraethyl-4,4'-diaminodiphenylmethane, and polytetramethylene oxide di-para aminobenzoate; condensates of aromatic diamines and epichlorohydrin; and reaction products of aromatic diamine and styrene.

Commercially available products may be used as a particular curing agent (B). Examples of commercially available products of a particular curing agent (B) include, but are not limited to, an amine curing agent (trade name: KAYA-HARD-AA; SP value: 11.1) manufactured by Nippon Kayaku Co., Ltd. and an amine curing agent (trade name: jER CURE W; SP value: 10.8) manufactured by Mitsubishi Chemical Corporation. Such particular curing agents (B) may be used singly, or in combination/mixture of two or more kinds thereof.

The content ratio of an epoxy resin (A) and a particular curing agent (B) in the liquid resin composition for sealing in this embodiment is not particularly limited. To minimize an unreacted portion of each component, the ratio of the number of equivalents of amino groups contained in a particular curing agent (B) with respect to the number of equivalents of epoxy groups contained in an epoxy resin (A) (the number of equivalents of amino groups/the number of equivalents of epoxy groups) is preferably in a range of from 0.6 to 1.4, more preferably in a range of from 0.7 to 1.3, and still more preferably in a range of from 0.8 to 1.2.

In this embodiment, other curing agents may be used as well as a particular curing agent (B). Examples of other curing agents include phenol curing agents, acid anhydride curing agents, and carboxylic acid dihydrazide curing agents.

In a case in which other curing agent(s) are used in combination with a particular curing agent (B), the proportion of other curing agent(s) with respect to the total of curing agent components is preferably from 1% by mass to 50% by mass, more preferably from 5% by mass to 35% by mass, and still more preferably from 8% by mass to 20% by mass.

<Polymer Resin (C)>

The liquid resin composition for sealing in this embodiment contains a polymer resin (C).

A polymer resin (C) used in the liquid resin composition for sealing in the first embodiment is not particularly limited as long as it has a weight average molecular weight (Mw) of 10,000 or more. From the viewpoints of heat resistance and fluidity, the weight average molecular weight (Mw) of a polymer resin (C) is preferably from 10,000 to 100,000.

When the weight average molecular weight of a polymer resin (C) is 10,000 or more, the effect of suppressing the bleed-out phenomenon tends to be excellent.

From the viewpoint of suppressing the bleed-out phenomenon, the SP value of a polymer resin (C) used in the liquid resin composition for sealing in the first embodiment is preferably from 9.0 to 12.5, more preferably from 9.2 to 12.5, and still more preferably from 9.4 to 12.5. It is considered that the use of a polymer resin (C) having an SP value in a range of from 9.0 to 12.5 cause a liquid component to flow out to a less extent, and the effect of suppressing the bleed-out phenomenon is further improved.

A polymer resin (C) used in the liquid resin composition for sealing in the second embodiment is not particularly limited as long as it has an SP value of from 9.0 to 12.5. The SP value of a polymer resin (C) used in the liquid resin composition for sealing in the second embodiment is preferably from 9.2 to 12.5 and more preferably from 9.4 to 12.5.

Examples of a polymer resin (C) having an SP value of from 9.0 to 12.5 include, for example, methacrylic acid polymers, polyurethane, polyester, phenol resins, phenoxy resins, and polyvinyl alcohol.

From the viewpoints of fluidity and heat resistance, the content of a polymer resin (C) is preferably in a range of from 0.05% by mass to 5% by mass, more preferably in a range of from 0.08% by mass to 3% by mass, and still more preferably in a range of from 0.1% by mass to 2% by mass with respect to the total solid content. Such a polymer resins (C) may be used singly, or in combination/mixture of two or more kinds thereof.

From the viewpoints of fluidity, heat resistance, and curing performance, a polymer resin (C) is preferably a polymer resin having a methacrylic acid ester structure, a polyester structure, or a phenoxy structure.

—Polymer Resin Having Methacrylic Acid Ester Structure—

Examples of a polymer resin having a methacrylic acid ester structure include a methacrylic acid polymer obtained by polymerizing one kind of methacrylate monomers.

In addition, examples of a polymer resin having a methacrylic acid ester structure include block copolymers including two or more kinds of polymer chains having different properties. A preferable block copolymer is an X-Y-X type or X-Y-X' type block copolymer. It is preferable that Y in the middle represents a soft block and X and X' on the both ends each represent a hard block in an X-Y-X type or X-Y-X' type block copolymer. In this embodiment, a soft block and a hard block are distinguished from each other in terms of a high or low level of the glass transition point (Tg) of a polymer chain. The term "soft block" refers to a polymer chain having the lowest Tg, and the term "hard block" refers to a polymer chain having relatively higher Tg than that of a soft block.

Tg of a soft block is preferably less than 0° C. and more preferably −20° C. or less. Tg of a hard block is preferably 0° C. or more and more preferably 50° C. or more.

In a case in which a polymer resin (C) is an X-Y-X type or X-Y-X' type block copolymer, a block copolymer for which Tg of a hard block is 50° C. or more and Tg of a soft block is −20° C. or less is still more preferable. In a case in which a block copolymer for which Tg of a hard block is 50° C. or more and Tg of a soft block is −20° C. or less is used, it is possible to easily render polymer chains on both ends (X and X') compatible with a resin matrix and a polymer chain (Y) in the middle incompatible with a resin matrix. It is therefore considered that a block copolymer is likely to have a specific structure in a resin matrix.

In the present specification, the glass-transition temperature can be determined by examining inflection points of a DSC curve measured using a differential scanning calorimeter. Tg of each polymer chain in a block copolymer including polymer chains having different Tg values can be determined based on an endothermic peak corresponding to Tg of each polymer chain on a DSC curve.

In a case in which a polymer resin (C) is an X-Y-X type or X-Y-X' type block copolymer, a polymer chain constituting X or X' includes preferably polymethyl(meth)acrylate (PMMA or PMAA), polystyrene (PS), or the like, and a polymer chain constituting Y includes preferably poly n-butyl acrylate (PBA), polybutadiene (PB), or the like. Such a polymer resin (C) includes more preferably a block copolymer of methyl methacrylate and butyl acrylate.

One example of commercially available block copolymers is an acrylic triblock copolymer produced via living polymerization, which is manufactured by ARKEMA K. K. Examples thereof include SBM type triblock copolymers represented by polystyrene-polybutadiene-polymethyl methacrylate, MAM type triblock copolymers represented by polymethyl methacrylate-polybutyl acrylate-polymethyl methacrylate, and carboxylic acid-modified or hydrophilic group-modified triblock copolymers of MAM N type, MAM A type, or the like. Examples of SBM type triblock copolymers include E41, E40, E21, and E20, examples of MAM type triblock copolymers include M51, M52, M53, and M22, examples of MAM N type triblock copolymers include 52N and 22N, and examples of MAM A type triblock copolymers include SM4032XM10.

KURARITY manufactured by KURARAY CO., LTD. is also a block copolymer induced from methyl methacrylate and butyl acrylate, and examples thereof include LA1114, LA2140e, LA2330, LA2250, and LA4285.

The content of methyl methacrylate-derived structural units in a block copolymer is preferably 30% by mass or more and more preferably 40% by mass or more. There is a tendency that as the content of methyl methacrylate-derived structural units in a copolymer increases, the SP value increases, which results in favorable compatibility with an epoxy resin and exertion of the effect of suppressing the bleed-out phenomenon to a greater extent. Among block copolymers manufactured by KURARAY CO., LTD., LA4285 having a methyl methacrylate-derived structural unit content of 50% by mass is still more preferably used from the viewpoint of suppressing the bleed-out phenomenon. Meanwhile, the content of methyl methacrylate-derived structural units in a block copolymer is preferably 80% by mass or less and more preferably 70% by mass or less.

The weight average molecular weight of a polymer resin having a methacrylic acid ester structure is preferably in a range of from 10,000 to 100,000, and from the viewpoint of fluidity, more preferably in a range of from 15,000 to 90,000. In addition, from the viewpoint of suppressing the bleed-out phenomenon, the weight average molecular weight is still more preferably in a range of from 20,000 to 85,000. When the weight average molecular weight of a polymer resin having a methacrylic acid ester structure is 10,000 or more, there is a tendency that an effect of improving toughness and flexibility can be obtained as well as the desired effect of suppressing the bleed-out phenomenon. In addition, when the weight average molecular weight of a polymer resin having a methacrylic acid ester structure is 100,000 or less, there is a tendency that deterioration of filling performance of an underfill due to an increase in viscosity of a liquid resin composition for sealing can be suppressed.

A polymer resin having a methacrylic acid ester structure that assumes a liquid state at 25° C. is preferable while a polymer resin having a methacrylic acid ester structure in a solid state at 25° C. may be used as well. In a case in which a polymer resin having a methacrylic acid ester structure is in a liquid state, the polymer resin can be easily dissolved in a composition. In a case in which a polymer resin having a methacrylic acid ester structure is in a solid state, it is possible to form a uniform composition by dissolving a polymer resin having a methacrylic acid ester structure in an epoxy resin (A) or a particular curing agent (B), thereby achieving stable properties.

The liquid resin composition for sealing in this embodiment tends to have improved fluidity when containing, as a polymer resin having a methacrylic acid ester structure, a polymer resin having a methacrylic acid ester structure that assumes a liquid state at 25° C.

—Polymer Resin Having Polyester Structure—

A polymer resin having a polyester structure is not particularly limited. A polymer resin having a polyester structure is preferably polyester polyol. One example of a polymer resin having a polyester structure is a reaction product of a polyol and carboxylic acid or its anhydride.

By using, as a polymer resin having a polyester structure, polyester polyol, it becomes possible to allow polyester polyol to be stably present in a liquid resin composition for sealing. This results in favorable storage stability and excellent compatibility of polyester polyol with other components.

In a case in which a polymer resin having a polyester structure is synthesized by reacting polyol and carboxylic acid or its anhydride, ends of the molecular chain are mainly carboxy group or hydroxy group. Polyester polyol used in this embodiment is a polymer resin having a polyester structure in which ends of the molecular chain are mainly hydroxy group. The hydroxy value of polyester polyol is preferably from 1 mg KOH/g to 100 mg KOH/g, more preferably from 2 mg KOH/g to 80 mg KOH/g, and still more preferably from 4 mg KOH/g to 60 mg KOH/g. In addition, the acid value of polyester polyol is preferably from 10 mg KOH/g or less, more preferably 8 mg KOH/g or less, and still more preferably 6 mg KOH/g or less.

A technique for determining a hydroxy value in the present specification is described below.

The hydroxy value is measured in accordance with JIS K 0070: 1992.

(a) Reagent
  Acetylation reagent (acetic acid anhydride-pyridine)
  N/2 potassium hydroxide-ethanol solution (b) Operation A measurement sample is acetylated with an acetylation reagent and then extra acetic acid is titrated with a N/2 potassium hydroxide-ethanol solution.

(c) Calculation

A hydroxy value is obtained by the following equation.

$$\text{Hydroxy value} = ((VB-V) \times F \times 28.05)/S$$

V: Titer of N/2 potassium hydroxide-ethanol solution in main test (mL)

VB: Titer of N/2 potassium hydroxide-ethanol solution in blank test (mL)

F: Factor of N/2 potassium hydroxide-ethanol solution

S: Amount of collected measurement sample (g)

A technique for determining an acid value in the present specification is described below.

A measurement sample in an amount of about 1 g is accurately weighed. Then, 30 g of acetone is added to the measurement sample to dissolve the sample. Next, an appropriate amount of phenolphthalein is added as an indicator to the resulting solution, and titration is performed using a 0.1N (mol/L) KOH aqueous solution. An acid value is calculated by the following equation.

$$A = 10 \times Vf \times 56.1/(Wp \times I)$$

In the equation, A represents an acid value (mg KOH/g), Vf represents a titer of a 0.1N KOH aqueous solution (mL), Wp represents a mass of a measurement sample (g), and I represents a proportion of non-volatile matter in a measurement sample (% by mass).

The proportion of non-volatile matter in a measurement sample (% by mass) is determined by the method described below.

About 2 g of a measurement sample is placed in an aluminum cup, and the mass of the sample placed, which is represented by W0, is measured to three decimal places. Subsequently, the measurement sample is dried in a thermostat bath at 100° C. for 1 hour, and the mass of non-volatile matter represented by W is measured to three decimal places. The proportion of non-volatile matter is calculated by the following equation.

$$\text{Proportion of non-volatile matter (\%)} = W/W0 \times 100$$

Examples of polyols used for synthesis of a polymer resin having a polyester structure include: low-molecular-weight polyols such as ethylene glycol, diethylene glycol, triethylene glycol, tetraethylene glycol, polyethylene glycol, propylene glycol, dipropylene glycol, tripropylene glycol, polypropylene glycol, butylene glycol, polybutylene glycol, tetramethylene glycol, hexamethylene glycol, neopentyl glycol, cyclohexanedimethanol, 3-methyl-1,5-pentanediol, 1,6-hexanediol, trimethylol propane, glycerin, pentaerythritol, and dipentaerythritol; and alkylene oxide adducts of low-molecular-weight polyols.

Examples of carboxylic acid or its anhydride used for synthesis of a polymer resin having a polyester structure include: for example, dibasic acids such as orthophthalic acid, isophthalic acid, terephthalic acid, adipic acid, succinic acid, fumaric acid, maleic acid, hexahydrophthalic acid, tetrahydrophthalic acid, and trimellitic acid; and anhydrides of such dibasic acids.

A polymer resin having a polyester structure is preferably a saturated compound and more preferably a saturated amorphous compound. As long as a polymer resin having a polyester structure is a saturated compound, the structure of a polymer resin having a polyester structure would not include a polyene structure. Thus, there is a tendency that deterioration of resistance to degradation and weatherability due to the presence of the polyene structure can be suppressed. In a case in which a polymer resin having a polyester structure is an amorphous compound, such a polymer resin having a polyester structure is unlikely to form a crystal structure. Thus, there is a tendency that viscosity of a liquid resin composition for sealing is unlikely to increase, and deterioration of filling performance is suppressed.

It is possible to confirm whether or not a polymer resin having a polyester structure is a saturated compound based on the iodine value. When the iodine value is 3 g/100 g or less, a polymer resin having a polyester structure can be confirmed to be a saturated compound.

A technique for determining an iodine value in the present specification is described below.

A measurement sample is accurately weighed in a range of from 0.25 g to 0.35 g, each sample is placed in a 200-mL iodine flask, and 30 mL of chloroform is added to dissolve the measurement sample. A Wijs reagent (prepared by adding 7.9 g of iodine trichloride and 8.2 g of iodine each separately to from 200 mL to 300 mL of glacial acetic acid and mixing the two solutions to make up an amount of 1 L) in an amount of 20 mL is accurately measured using a whole pipette and added to the obtained solution. Next, 10 mL of a 2.5% by mass mercuric acetate/glacial acetic acid solution is added, and the resulting solution is left in a dark place for 20 minutes to complete the reaction. A newly prepared 20% by mass KI solution in an amount of 5 mL is added thereto. The resulting solution is titrated with a $0.1N-Na_2S_2O_3$ standard solution using a 1% by mass starch solution as an indicator. A blank test is conducted in the same manner, and an iodine value Y is calculated by the following equation.

$$\text{Iodine value } Y \text{ (g/100 g)} = (A \text{ mL} - B \text{ mL}) 0.1 N \times f \times 126.9 \times 100/S \text{ g}$$

A: Amount in mL of $0.1N-Na_2S_2O_3$ standard solution required in blank test

B: Amount in mL of $0.1N-Na_2S_2O_3$ standard solution required in main test f: Titer of $0.1N-Na_2S_2O_3$ standard solution S: Amount in g of measurement sample It is possible to confirm whether or not a polymer resin having a polyester structure is an amorphous resin by confirming whether or not the polymer resin has a melting point measurable by differential scanning calorimetry (DSC). A resin without a measurable melting point can be confirmed to be an amorphous resin.

The weight average molecular weight of a polymer resin having a polyester structure is preferably in a range of from 10,000 to 100,000, and from the viewpoint of fluidity, more preferably in a range of from 10,000 to 50,000.

Tg of a polymer resin having a polyester structure is preferably in a range of from −20° C. to 100° C. and more preferably in a range of from −20° C. to 80° C.

The molecular weight distribution (Mw/Mn) of a polymer resin having a polyester structure is preferably 3 or less and more preferably 2.5 or less.

By setting the weight average molecular weight and Tg of a polymer resin having a polyester structure in the above ranges, it becomes possible to impart flexibility and toughness to a cured product, thereby allowing the cured product to contribute as an underfill to the improvement of reliability.

A commercially available polymer resin having a polyester structure may be used. Specific examples thereof include VYLON (amorphous polyester such as VYLON 200, VYLON 240, VYLON 245, VYLON 280, VYLON 296, or VYLON 600) manufactured by TOYOBO CO., LTD.

A polymer resin having a polyester structure that assumes a liquid state at 25° C. is preferable while a polymer resin having a polyester structure in a solid state at 25° C. may be used as well. In a case in which a polymer resin having a polyester structure is in a liquid state, it can be easily dissolved in a composition. In a case in which a polymer resin having a polyester structure is in a solid state, it is possible to form a uniform composition by dissolving a polymer resin having a polyester structure in an epoxy resin (A) or a particular curing agent (B), thereby achieving stable properties.

The liquid resin composition for sealing in this embodiment tends to have improved fluidity when containing, as a polymer resin having a polyester structure, a polymer resin having a polyester structure that assumes a liquid state at 25° C.

Polymer Resin Having Phenoxy Structure

A polymer resin having a phenoxy structure contains highly reactive epoxy groups, hydroxy groups, and the like in its skeleton. A polymer resin having a phenoxy structure used in this embodiment may be an epoxy resin having an epoxy equivalent weight of 3,000 g/eq or more.

Examples of a polymer resin having a phenoxy structure include a phenoxy resin having a bisphenol skeleton, a phenoxy resin having a novolak skeleton, a phenoxy resin having a naphthalene skeleton, and a phenoxy resin having a biphenyl skeleton.

Examples of a phenoxy resin having a bisphenol skeleton include, for example, a bisphenol A type epoxy resin, a bisphenol F type epoxy resin, a copolymerized epoxy resin of bisphenol A and bisphenol F, a bisphenol S type epoxy resin, a brominated bisphenol A type epoxy resin, and a hydrogenated bisphenol A type epoxy resin. The epoxy equivalent weights of these phenoxy resins having a bisphenol skeleton may be 3,000 g/eq or more.

Among these polymer resins having a phenoxy structure, bisphenol F type epoxy resin, a bisphenol A type epoxy resin, or a copolymerized epoxy resin of bisphenol A and bisphenol F is preferable from the viewpoints of cost, fluidity, and heat resistance.

The weight average molecular weight of a polymer resin having a phenoxy structure is preferably in a range of from 10,000 to 100,000, and from the viewpoint of fluidity, more preferably in a range of from 15,000 to 90,000. In addition, from the viewpoint of suppressing the bleed-out phenomenon, the weight average molecular weight is still more preferably in a range of from 20,000 to 85,000.

Examples of a commercially available phenoxy resin include, for example, jER-1256, jER-4250, and jER-4275 manufactured by Mitsubishi Chemical Corporation and YP-50, YP-50S, YP-70, ZX-1356-2, FX-316, YPB-43C, and YPB-43M manufactured by NIPPON STEEL & SUMIKIN CHEMICAL CO., LTD. Such phenoxy resins have excellent heat resistance and humidity resistance and also have the effect of suppressing the bleed-out phenomenon and can contribute to the improvement of reliability after package sealing.

A polymer resin having a phenoxy structure that assumes a liquid state at 25° C. is preferable while a polymer resin having a phenoxy structure in a solid state may be used as well. In a case in which a polymer resin having a phenoxy structure is in a liquid state, it can be easily dissolved in a composition. In a case in which a polymer resin having a phenoxy structure is in a solid state, it is possible to form a uniform composition by dissolving a polymer resin having a phenoxy structure in an epoxy resin (A) or a particular curing agent (B), thereby achieving stable properties.

The liquid resin composition for sealing in this embodiment tends to have improved fluidity when containing, as a polymer resin having a phenoxy structure, a polymer resin having a phenoxy structure that assumes a liquid state at 25° C.

In this embodiment, the difference between the SP value of an epoxy resin (A) and the SP value of a polymer resin (C) is preferably in a range of from 4 to 6, more preferably in a range of from 2 to 4, and still more preferably in a range of from 0 to 2.

In this embodiment, the difference between the SP value of a particular curing agent (B) and the SP value of a polymer resin (C) is preferably in a range of from 4 to 6, more preferably in a range of from 2 to 4, and still more preferably in a range of from 0 to 2.

<Inorganic Filler (D)>

The liquid resin composition for sealing in this embodiment contains an inorganic filler (D).

The liquid resin composition for sealing containing an inorganic filler (D) is preferable from the viewpoints of heat cycle resistance, humidity resistance, and stress reduction on a cured product.

An inorganic filler (D) is not particularly limited. Specific examples of an inorganic filler (D) include: silica such as colloidal silica, hydrophobic silica, or spherical silica; and talc. Of these, spherical silica is preferable from the viewpoint of fluidity.

In this embodiment, when silica is "spherical," it has the following meaning. Specifically, in a case in which natural silica or synthetic silica is heat-treated to be spheroidized, unmelted particles might not have a true spherical shape. In addition, a fusion product of melted particles might coexist. Further, evaporated silica vapor might adhere to the surfaces of other particles and become solid, resulting in generation of spherical silica particles to which fine particles are adhering. When silica is substantially spherical, the coexistence of particles having such a shape is acceptable. However, in a case in which, for example, the value of particle sphericity is represented by Wadell's sphericity ((the diameter of a circle area equal to a projection area of a particle)/(the diameter of the smallest circle circumscribed onto a projection image of a particle)), in a case in which particles having values of particle sphericity of 0.9 or more account for 90% by mass or more of the silica as a whole, it can be said that silica is "spherical."

An inorganic filler (D) is more preferably spherical silica having an average particle size of from 0.01 μm to 20 μm and still more preferably spherical silica having an average particle size of from 0.02 μm to 10 μm.

A technique for determining an average particle size in the present specification is described below.

The average particle size is a value measured based on a particle size distribution derived from the number and frequency of particles using a laser diffraction/scattering type particle size distribution analyzer LA-920 (manufactured by HORIBA, Ltd.). It is preferable to use, as a dispersion medium, water, acetone, or ethanol to disperse particles. Measurement conditions include setting a particle concentration to from several tens to several hundreds of ppm based on the mass scale, setting the ultrasonic treatment time to 30 minutes, and determining the measurement temperature to be ordinary temperature (25° C.).

Examples of a commercially available inorganic filler (D) include, but are not specifically limited to, spherical silica (trade name: SO-E2) manufactured by Admatechs Company Limited and spherical silica (trade name: SE2300) manufactured by Admatechs Company Limited.

Such inorganic fillers (D) may be used singly, or in combination/mixture of two or more kinds thereof.

An inorganic filler (D), which is surface-treated in advance with at least one kind of coupling agents (F) described later, may be used. Alternatively, an inorganic filler (D) which is surface-treated with a coupling agent (F) and an inorganic filler (D) which is not surface-treated may be used in combination. By using an inorganic filler (D) which is surface-treated with a coupling agent (F), it becomes possible to improve affinity between an inorganic filler (D) and a resin component, thereby improving workability and fluidity of a liquid resin composition for sealing and toughness, elastic modulus, and adhesive force of a cured product.

In a case in which an inorganic filler (D) is surface-treated with a coupling agent (F), regarding the ratio of an inorganic filler (D) and a coupling agent (F), the proportion of a coupling agent (F) is preferably from 0.2% by mass to 5% by mass, more preferably from 0.3% by mass to 3% by mass, still more preferably from 0.4% by mass to 2% by mass with respect to an inorganic filler (D).

The content of an inorganic filler (D) is preferably from 40% by mass to 85% by mass, more preferably from 46% by mass to 78% by mass, and still more preferably from 50% by mass to 70% by mass with respect to the total solid content.

<Rubber Additive (E)>

A liquid resin composition for sealing may contain a rubber additive (E), if necessary.

A liquid resin composition for sealing containing a rubber additive (E) is preferable from the viewpoint of stress relief.

Type of a rubber additive (E) is not particularly limited and thus can be selected from conventionally known examples thereof and used, if appropriate. Specific examples of a rubber additive (E) include acrylic rubbers, urethane rubbers, silicone rubbers, and butadiene rubbers. A rubber additive (E) that assumes a solid or liquid state at 25° C. may be used. From the viewpoint of heat resistance, a rubber additive (E) is preferably in the particle form.

In a case in which a rubber additive (E) is in a solid state at 25° C., the form of a rubber additive (E) is not particularly limited, and a rubber additive (E) in the form of particles, powder, pellets, or the like can be used. In a case in which a rubber additive (E) is in the form of particles, the average particle size is preferably from 0.01 μm to 20 μm, more preferably from 0.02 μm to 10 μm, and still more preferably from 0.03 μm to 5 μm.

In a case in which a rubber additive (E) is in a liquid state at 25° C., examples of such a rubber additive (E) include low-molecular-weight components such as polybutadiene, butadiene-acrylonitrile copolymers, polyisoprene, polypropylene oxide, and polyorganosiloxane. In a case in which a rubber additive (E) that is a low-molecular-weight component is used, the weight average molecular weight of such a rubber additive (E) is preferably from 5,000 to 80,000 and more preferably from 8,000 to 50,000.

In a case in which a rubber additive (E) is in a solid state at 25° C., it is preferably heated to be dissolved in an epoxy resin (A) or a particular curing agent (B) so as to be used.

In addition, a rubber additive (E) having an end group that reacts with an epoxy group can be used. A rubber additive (E) having an end group that reacts with an epoxy group may assume a solid or liquid state at 25° C. Examples of a group that reacts with an epoxy group include a carboxy group, a hydroxy group, and an amino group.

Examples of a commercially available rubber additive (E) include, but are not limited to, CTBN1300, ATBN1300-16, and CTBN1008-SP manufactured by Ube Industries, Ltd., a silicone rubber powder (trade name: AY42-119) manufactured by Dow Corning Toray Co., Ltd., and a rubber powder (trade name: XER81) manufactured by JSR Corporation. In addition, a rubber additive (E) may be used singly, or in combination/mixture of two or more kinds thereof.

In a case in which a liquid resin composition for sealing contains a rubber additive (E), the content of a rubber additive (E) is preferably from 0.1% by mass to 10% by mass, more preferably from 0.3% by mass to 5% by mass, and still more preferably from 0.5% by mass to 3% by mass with respect to the total solid content.

<Coupling Agent>

A liquid resin composition for sealing may contain a coupling agent (F), if necessary.

A liquid resin composition for sealing containing a coupling agent (F) is preferable from the viewpoint of adhesiveness.

Type of a coupling agent (F) is not particularly limited and thus can be selected from conventionally known examples thereof and used, if appropriate. Specific examples of a coupling agent (F) include: silane compounds such as a silane compound having at least one kind selected from the group consisting of a primary amino group, a secondary amino group, and a tertiary amino group, a silane compound having epoxy groups, a silane compound having mercapto groups, a silane compound having alkyl groups, a silane compound having ureido groups, a silane compound having vinyl groups; and titanate compounds. Of these, a silane compound having epoxy groups is preferable from the viewpoint of adhesiveness.

Examples of a commercially available coupling agent (F) include, but are not specifically limited to, KBM-403, KBE-903, and KBE-9103 manufactured by Shin-Etsu Chemical Co., Ltd. Such coupling agents (F) may be used singly, or in combination/mixture of two or more kinds thereof.

A coupling agent (F) may be contained, as a surface treatment agent for an inorganic filler (D), in a state of adhering to the surface of an inorganic filler (D) in a liquid resin composition for sealing.

In a case in which a liquid resin composition for sealing contains a coupling agent (F), the content of a coupling agent (F) is preferably from 0.1% by mass to 2% by mass, more preferably from 0.2% by mass to 1.5% by mass, and still more preferably from 0.3% by mass to 1% by mass with respect to the total solid content.

<Other Components>

A liquid resin composition for sealing may further contain a thixotropic agent for the improvement of workability, a coloring agent such as carbon black, a dye, an ion-trapping agent, a defoamer, a leveling agent, an antioxidant, a reactivity diluent, an organic solvent, and the like if necessary, as long as the object of the invention is achieved.

<Method of Preparing Liquid Resin Composition for Sealing>

A liquid resin composition for sealing can be prepared by stirring, melting, mixing, or dispersing and if necessary, performing defoaming an epoxy resin (A), a particular curing agent (B), a polymer resin (C), an inorganic filler (D), and other additives collectively or separately during heating as needed. In particular, in a case in which an epoxy resin (A), a particular curing agent (B), and a polymer resin (C) are in a solid state, when these components are mixed in a solid state, resin viscosity increases, which results in deterioration of workability. Therefore, it is preferable to liquidify the components by heating in advance before mixing or the like. A system for mixing, stirring, dispersing, and the like is not particularly limited. A grinder equipped with a stirrer and a heater, a triple roll mill, a ball mill, a planetary mixer, a bead mill, or the like can be used.

<Physical Properties of Liquid Resin Composition for Sealing>

Viscosity of a liquid resin composition for sealing is not particularly limited. From the viewpoint of fluidity, the viscosity is preferably from 0.1 Pa·s to 100.0 Pa·s and more preferably from 0.1 Pa·s to 50.0 Pa·s at 25° C. Viscosity of a liquid resin composition for sealing is measured using an E type viscometer (cone angle: 3°; rotational speed: 10 min$^{-1}$) at 25° C.

In a case in which a liquid resin composition for sealing is used as an underfill material for a flip chip, as an index for filling a narrow gap of several tens to several hundreds of micrometers at from about 100° C. to 120° C., viscosity of a liquid resin composition for sealing at 110° C. is preferably 0.20 Pa·s or less, more preferably 0.15 Pa·s or less, and still more preferably 0.10 Pa·s or less. Viscosity of a liquid resin composition for sealing at 110° C. is measured by a rheometer AR2000 (manufactured by TA Instruments; aluminum cone: 40 mm; shear rate: 32.5/sec).

For a liquid resin composition for sealing, the thixotropic index which is the ratio of viscosity measured at 25° C. by an E type viscometer at a rotational speed of 2.5 min$^{-1}$ relative to viscosity measured under the same conditions at a rotational speed of 10 min$^{-1}$ ((viscosity at a rotational speed of 2.5 min$^{-1}$)/(viscosity at a rotational speed of 10 min$^{-1}$)) is preferably from 0.5 to 1.5 and more preferably from 0.8 to 1.2.

The thixotropic index in the above range allows the improvement of fillet forming property in a case in which a liquid resin composition for sealing is used as an underfill material. The viscosity and thixotropic index of a liquid resin composition for sealing can be set in a desirable range by appropriately selecting the composition of an epoxy resin, the content of an inorganic filler, and if necessary, the type and content of a thixotropic agent to be used.

Pot life that is an index of storage stability of a liquid resin composition for sealing is calculated as a rate of changes in viscosity before and after storage in an atmosphere at 25° C. for 24 hours by the following equation.

Pot life (%)=100×((Viscosity after storage−Viscosity before storage)/Viscosity before storage)

A smaller pot life means a higher level of storage stability. The pot life is preferably 150% or less, more preferably 130% or less, and still more preferably 100% or less.

[Electronic Component Device]

An electronic component device in this embodiment includes a substrate having a circuit layer; an element which is disposed on the substrate and electrically connected to the circuit layer; and a cured product of the liquid resin composition for sealing in this embodiment, which is filled into a gap between the substrate and the element. The electronic component device in this embodiment can be obtained by sealing an element using the liquid resin composition for sealing in this embodiment. As the element is sealed with the liquid resin composition for sealing in this embodiment, the electronic component device in this embodiment is excellent in heat cycle resistance.

Examples of the electronic component device include an electronic component device obtained by mounting active elements such as a semiconductor chip, a transistor, a diode, and a thyristor or passive elements such as a capacitor, a resistor, a resistor array, a coil, and a switch on a support member such as a lead frame, a prewired tape carrier, a rigid wiring board, a flexible wiring board, glass, or a silicon wafer, and sealing portions need to be sealed with the liquid resin composition for sealing in this embodiment. In particular, a semiconductor device obtained by flip chip bonding of a semiconductor element via bump connection to a rigid wiring board, a flexible wiring board, a prewired tape carrier, or the like, can be a target application of the electronic component device in this embodiment. Specific examples include electronic component devices such as flip chip BGA (Ball Grid Array)/LGA (Land Grid Array), COF (Chip on Film), or the like.

The liquid resin composition for sealing in this embodiment is a favorable underfill material for flip chip with excellent reliability. The use of the liquid resin composition for sealing in this embodiment is particularly favorable in the field of flip chip involving flip chip semiconductor parts in which a lead-free Sn-A g-Cu solder is used instead of a conventional lead-containing solder as a bump material for connecting a wiring substrate and a semiconductor element. According to the liquid resin composition for sealing in this embodiment, favorable reliability can be maintained for flip chip involving bump connection even by a lead-free solder having poor physical properties, compared with a conventional lead solder. In addition, when mounting a chip scale package such as wafer-level CSP on a substrate, it is possible to improve the reliability by applying the liquid resin composition for sealing in this embodiment.

Examples of a method of sealing electronic parts with the liquid resin composition for sealing in this embodiment include a dispensing method, a casting method, and a printing method.

Curing conditions and the like for curing the liquid resin composition for sealing in this embodiment are not particularly limited, and for example, it is preferable to conduct heat treatment at from 80° C. to 165° C. for from 1 minute to 150 minutes.

An electronic component device such as a flip chip mounting body in which the bleed-out phenomenon is suppressed can be easily produced using the liquid resin composition for sealing in this embodiment.

EXAMPLES

Hereinafter, the invention will be described with reference to the Examples. However, the invention is not limited to the Examples below. The expressions "part(s)" and "%" refer to "part(s) by mass" and "% by mass," respectively, in the Examples below unless otherwise specified.

Liquid resin composition for sealings in Examples 1 to 19 and Comparative Example 1 were produced by mixing components to prepare the compositions listed in Tables 1 to 4, followed by kneading and dispersing by a triple roll mill and a vacuum grinder. The unit for each mixed component in Tables 1 to 4 is "part(s) by mass" and the symbol "-" indicates "Not mixed." Further, the content (% by mass) of an inorganic filler in a liquid resin composition for sealing was calculated based on the amount of each component mixed.

Examples 1 to 19, Comparative Example 1

The following materials were prepared as epoxy resins (A).

Epoxy resin 1: Bisphenol F type epoxy resin (trade name: "YDF-8170C" with an epoxy equivalent weight of 160 g/eq, a weight average molecular weight of 350, and an SP value of 11.4 manufactured by NIPPON STEEL & SUMIKIN CHEMICAL CO., LTD)

Epoxy resin 2: Amine type epoxy resin having trifunctional epoxy groups (trade name: "jER-630" with an epoxy equivalent weight of 96 g/eq, a weight average molecular weight of 290, and an SP value of 11.0 manufactured by Mitsubishi Chemical Corporation)

The following materials were prepared as particular curing agents (B).

Amine curing agent 1: Diaminotoluene type amine curing agent (trade name: "jER CURE W" with an SP value of 10.8 manufactured by Mitsubishi Chemical Corporation)

Amine curing agent 2: Diaminodiphenylmethane type amine curing agent (manufactured by Nippon Kayaku Co., Ltd.; trade name: "KAYAHARD-AA"; SP value: 11.1)

The following materials were prepared as polymer resins (C).

(Polymer Resin Having Methacrylic Acid Ester Structure)

Polymer resin 1 (trade name: "LA1114" with a weight average molecular weight of from 60,000 to 80,000, an SP value of 9.2, and a methyl methacrylate-derived structural unit content of 5% by mass manufactured by KURARAY CO., LTD.)

Polymer resin 2 (trade name: "LA2140e" with a weight average molecular weight of from 60,000 to 80,000, an SP value of 9.4, and a methyl methacrylate-derived structural unit content of 20% by mass manufactured by KURARAY CO., LTD.)

Polymer resin 3 (trade name: "LA2250" with a weight average molecular weight of from 60,000 to 80,000, an SP value of 9.5, and a methyl methacrylate-derived structural unit content of 30% by mass manufactured by KURARAY CO., LTD.)

Polymer resin 4 (trade name: "LA4285" with a weight average molecular weight of from 60,000 to 80,000, an SP value of 9.6, and a methyl methacrylate-derived structural unit content of 50% by mass manufactured by KURARAY CO., LTD.)

(Polymer Resin Having Polyester Structure)

Polymer resin 5 (amorphous resin; trade name: "VYLON 200" with a hydroxy value of 5 mg KOH/g, an acid value of 2 mg KOH/g, and a weight average molecular weight of 40,000 manufactured by TOYOBO CO., LTD.)

Polymer resin 6 (amorphous resin; trade name: "VYLON 280" with a hydroxy value of 6 mg KOH/g, an acid value of 2 mg KOH/g, and a weight average molecular weight of 40,000 manufactured by TOYOBO CO., LTD.)

Polymer resin 7 (amorphous resin; trade name: "VYLON 500" with a hydroxy value of 5 mg KOH/g, an acid value of 2 mg KOH/g, and a weight average molecular weight of 50,000 manufactured by TOYOBO CO., LTD.)

(Polymer Resin Having Phenoxy Structure)

Polymer resin 8 (trade name: "ZX-1356-2" with a weight average molecular weight of 50,000 manufactured by NIPPON STEEL & SUMIKIN CHEMICAL CO., LTD.)

Polymer resin 9 (trade name: "jER-1256" with an epoxy equivalent weight of 8,000 g/eq and a weight average molecular weight of 50,000 manufactured by Mitsubishi Chemical Corporation)

The following materials were prepared as inorganic fillers (D).

Inorganic filler 1: Spherical silica having an average particle size of 0.5 μm treated with a silane compound including an epoxy group (trade name: "SE2200-SEJ" manufactured by Admatechs Company Limited)

Carbon black (trade name: "MA-100" manufactured by Mitsubishi Chemical Corporation) was used as a coloring agent.

Properties of the liquid resin composition for sealings obtained above were evaluated in the manner described below. In addition, Tables 1 to 4 list the values.

(1) Flow Characteristics: Viscosity and Thixotropic Index

Viscosity (Pa·s) of each liquid resin composition for sealing at 25° C. was measured using an E type viscometer (cone angle: 3°; rotational speed: 10 min$^{-1}$).

In addition, the thixotropic index was determined to be the ratio of viscosity measured at 25° C. at a rotational speed of 2.5 min$^{-1}$ relative to viscosity measured under the same conditions at a rotational speed of 10 min$^{-1}$ ((viscosity at a rotational speed of 2.5 min$^{-1}$)/(viscosity at a rotational speed of 10 min$^{-1}$)).

Viscosity (Pa·s) at 110° C. was measured using a rheometer AR2000 (aluminum cone: 40 mm; shear rate: 32.5/sec).

(2) Heat Resistance: Tg, Coefficient of Thermal Expansion (CTE)

A test sample (φ 4 mm×20 mm) prepared by curing each liquid resin composition for sealing under the following conditions was measured with a load of 15 g at a measurement temperature of from −50° C. to 220° C. and a temperature increase rate of 5° C./minute using a thermomechanical analyzer (trade name: TMAQ400 manufactured by TA Instruments Japan Inc.).

The coefficient of thermal expansion in a range of temperatures equal to or below Tg was determined to be CTE1, and the coefficient of thermal expansion in a range of temperatures equal to or above Tg was determined to be CTE2. Tg and CTE indicate thermal stability, and it is preferable that Tg is around 100° C. and CTE1 and CTE2 are as low as possible.

(Curing Conditions)

Curing conditions included curing at 165° C. for 2 hours.

(3) Measurement of Length of Bleed-Out

A solder resist substrate was treated by Ar$_2$ plasma (400 W, 2 minutes). A liquid resin composition for sealing loaded into a syringe was ejected in an amount of 30 mg via a 25 G needle on the solder resist substrate treated by Ar$_2$ plasma for potting and cured at 150° C. for 120 minutes. After curing, the length of bleed-out was measured using an optical microscope. Tables 1 to 4 list the results. As a substrate for evaluation, a substrate obtained by forming solder resist 1 (PSR-4000 AUS308 manufactured by TAIYO HOLDINGS CO., LTD.) and solder resist 2 (PSR-4000 AUS703 manufactured by TAIYO HOLDINGS CO., LTD.) on FR-4 (MRC-E-679 manufactured by Hitachi Chemical Co., Ltd.) was used.

TABLE 1

| Component | Trade name | Unit | Example 1 | Example 2 | Example 3 | Example 4 | Example 5 |
|---|---|---|---|---|---|---|---|
| Epoxy resin 1 | YDF-8170C | Part(s) | 50 | 50 | 50 | 50 | 50 |
| Epoxy resin 2 | jER-630 | | 50 | 50 | 50 | 50 | 50 |
| Amine curing agent 1 | jER CURE W | | 18.9 | 18.9 | 18.9 | 18.9 | 18.9 |
| Amine curing agent 2 | KAYAHARD-AA | | 26.4 | 26.4 | 26.4 | 26.4 | 26.4 |
| Coloring agent | MA-100 | | 0.1 | 0.1 | 0.1 | 0.1 | 0.1 |
| Polymer resin 1 | LA1114 | | 2 | — | — | — | — |
| Polymer resin 2 | LA2140e | | — | 2 | — | — | — |
| Polymer resin 3 | LA2250 | | — | — | 2 | — | — |
| Polymer resin 4 | LA4285 | | — | — | — | 2 | 5 |
| Polymer resin 5 | VYLON 200 | | — | — | — | — | — |
| Polymer resin 6 | VYLON 280 | | — | — | — | — | — |
| Polymer resin 7 | VYLON 500 | | — | — | — | — | — |
| Polymer resin 8 | ZX-1356-2 | | — | — | — | — | — |
| Polymer resin 9 | jER-1256 | | — | — | — | — | — |
| Inorganic filler | SE2200-SEJ | | — | — | — | — | — |
| Amount of inorganic filler | | | 221.1 | 221.1 | 221.1 | 221.1 | 225.6 |
| Content of inorganic filler | | % by mass | 60 | 60 | 60 | 60 | 60 |
| (1) Flow characteristics Viscosity | | Pa·s | 13 | 14 | 14 | 15 | 22 |
| Thixotropic index | | — | 0.7 | 0.7 | 0.7 | 0.7 | 0.8 |
| Viscosity at 110° C. | | Pa·s | 0.091 | 0.101 | 0.101 | 0.097 | 0.153 |
| (2) Heat resistance Tg | | ° C. | 126 | 126 | 126 | 126 | 127 |
| CTE1 | | ppm/° C. | 31 | 31 | 32 | 31 | 32 |
| CTE2 | | | 96 | 99 | 95 | 96 | 96 |
| Bleed-out | AUS308 | μm | 336 | 254 | 255 | 183 | 87 |
| | AUS703 | | 424 | 306 | 372 | 268 | 106 |

TABLE 2

| Component | Trade name | Unit | Example 6 | Example 7 | Example 8 | Example 9 | Example 10 |
|---|---|---|---|---|---|---|---|
| Epoxy resin 1 | YDF-8170C | Part(s) | 50 | 50 | 50 | 50 | 50 |
| Epoxy resin 2 | jER-630 | | 50 | 50 | 50 | 50 | 50 |
| Amine curing agent 1 | jER CURE W | | 18.9 | 18.9 | 18.9 | 18.9 | 18.9 |
| Amine curing agent 2 | KAYAHARD-AA | | 26.4 | 26.4 | 26.4 | 26.4 | 26.4 |
| Coloring agent | MA-100 | | 0.1 | 0.1 | 0.1 | 0.1 | 0.1 |
| Polymer resin 1 | LA1114 | | — | — | — | — | — |
| Polymer resin 2 | LA2140e | | — | — | — | — | — |
| Polymer resin 3 | LA2250 | | — | — | — | — | — |
| Polymer resin 4 | LA4285 | | 10 | — | — | — | — |
| Polymer resin 5 | VYLON 200 | | — | 2 | 5 | 10 | — |
| Polymer resin 6 | VYLON 280 | | — | — | — | — | 2 |
| Polymer resin 7 | VYLON 500 | | — | — | — | — | — |
| Polymer resin 8 | ZX-1356-2 | | — | — | — | — | — |
| Polymer resin 9 | jER-1256 | | — | — | — | — | — |
| Inorganic filler | SE2200-SEJ | | — | — | — | — | — |
| Amount of inorganic filler | | | 233.1 | 221.1 | 225.6 | 233.1 | 221.1 |
| Content of inorganic filler | | % by mass | 60 | 60 | 60 | 60 | 60 |
| (1) Flow characteristics Viscosity | | Pa·s | 45 | 16 | 25 | 57 | 19 |
| Thixotropic index | | — | 0.9 | 0.8 | 0.9 | 1.1 | 1.3 |
| Viscosity at 110° C. | | Pa·s | 0.258 | 0.111 | 0.148 | 0.338 | 0.785 |
| (2) Heat resistance Tg | | ° C. | 125 | 125 | 124 | 122 | 126 |
| CTE1 | | ppm/° C. | 31 | 31 | 32 | 31 | 29 |
| CTE2 | | | 95 | 97 | 97 | 96 | 92 |
| Bleed-out | AUS308 | μm | 61 | 128 | 82 | 64 | 144 |
| | AUS703 | | 69 | 205 | 239 | 129 | 169 |

TABLE 3

| Component | Trade name | Unit | Example 11 | Example 12 | Example 13 | Example 14 | Example 15 |
|---|---|---|---|---|---|---|---|
| Epoxy resin 1 | YDF-8170C | Part(s) | 50 | 50 | 50 | 50 | 50 |
| Epoxy resin 2 | jER-630 | | 50 | 50 | 50 | 50 | 50 |
| Amine curing agent 1 | jER CURE W | | 18.9 | 18.9 | 18.9 | 18.9 | 18.9 |

TABLE 3-continued

|  |  |  | Example | | | | |
| --- | --- | --- | --- | --- | --- | --- | --- |
| Component | Trade name | Unit | 11 | 12 | 13 | 14 | 15 |
| Amine curing agent 2 | KAYAHARD-AA |  | 26.4 | 26.4 | 26.4 | 26.4 | 26.4 |
| Coloring agent | MA-100 |  | 0.1 | 0.1 | 0.1 | 0.1 | 0.1 |
| Polymer resin 1 | LA1114 |  | — | — | — | — | — |
| Polymer resin 2 | LA2140e |  | — | — | — | — | — |
| Polymer resin 3 | LA2250 |  | — | — | — | — | — |
| Polymer resin 4 | LA4285 |  | — | — | — | — | — |
| Polymer resin 5 | VYLON 200 |  | — | — | — | — | — |
| Polymer resin 6 | VYLON 280 |  | — | — | — | — | — |
| Polymer resin 7 | VYLON 500 |  | 2 | — | — | — | — |
| Polymer resin 8 | ZX-1356-2 |  | — | 2 | — | — | — |
| Polymer resin 9 | jER-1256 |  | — | — | 0.5 | 1 | 2 |
| Inorganic filler | SE2200-SEJ |  | — | — | — | — | — |
| Amount of inorganic filler |  |  | 221.1 | 221.1 | 218.8 | 219.6 | 221.1 |
| Content of inorganic filler |  | % by mass | 60 | 60 | 60 | 60 | 60 |
| (1) Flow characteristics | Viscosity | Pa · s | 15 | 16 | 11 | 13 | 22 |
|  | Thixotropic index | — | 0.8 | 0.8 | 0.8 | 0.8 | 0.8 |
|  | Viscosity at 110° C. | Pa · s | 0.110 | 0.142 | 0.104 | 0.107 | 0.131 |
| (2) Heat resistance | Tg | ° C. | 124 | 127 | 128 | 126 | 127 |
|  | CTE1 | ppm/° C. | 31 | 31 | 30 | 31 | 31 |
|  | CTE2 |  | 94 | 98 | 98 | 97 | 99 |
| Bleed-out | AUS308 | μm | 170 | 211 | 401 | 401 | 64 |
|  | AUS703 |  | 216 | 270 | 363 | 308 | 160 |

TABLE 4

|  |  |  | Example | | | | Comparative Example |
| --- | --- | --- | --- | --- | --- | --- | --- |
| Component | Trade name | Unit | 16 | 17 | 18 | 19 | 1 |
| Epoxy resin 1 | YDF-8170C | Part(s) | 50 | 50 | 50 | 50 | 50 |
| Epoxy resin 2 | jER-630 |  | 50 | 50 | 50 | 50 | 50 |
| Amine curing agent 1 | jER CURE W |  | 18.9 | 18.9 | 18.9 | 18.9 | 18.9 |
| Amine curing agent 2 | KAYAHARD-AA |  | 26.4 | 26.4 | 26.4 | 26.4 | 26.4 |
| Coloring agent | MA-100 |  | 0.1 | 0.1 | 0.1 | 0.1 | 0.1 |
| Polymer resin 1 | LA1114 |  | — | — | — | — | — |
| Polymer resin 2 | LA2140e |  | — | — | — | — | — |
| Polymer resin 3 | LA2250 |  | — | — | — | — | — |
| Polymer resin 4 | LA4285 |  | 2 | 2 | — | 2 | — |
| Polymer resin 5 | VYLON 200 |  | — | 2 | 2 | 2 | — |
| Polymer resin 6 | VYLON 280 |  | — | — | — | — | — |
| Polymer resin 7 | VYLON 500 |  | — | — | — | — | — |
| Polymer resin 8 | ZX-1356-2 |  | — | — | — | — | — |
| Polymer resin 9 | jER-1256 |  | 2 | — | 2 | 2 | — |
| Inorganic filler | SE2200-SEJ |  | — | — | — | — | — |
| Amount of inorganic filler |  |  | 224.1 | 224.1 | 224.1 | 227.1 | 218.1 |
| Content of inorganic filler |  | % by mass | 60 | 60 | 60 | 60 | 60 |
| (1) Flow characteristics | Viscosity | Pa · s | 24 | 19 | 27 | 34 | 9 |
|  | Thixotropic index | — | 0.9 | 0.8 | 0.9 | 0.9 | 0.8 |
|  | Viscosity at 110° C. | Pa · s | 0.154 | 0.136 | 0.152 | 0.190 | 0.108 |
| (2) Heat resistance | Tg | ° C. | 127 | 125 | 125 | 123 | 127 |
|  | CTE1 | ppm/° C. | 31 | 31 | 31 | 30 | 31 |
|  | CTE2 |  | 96 | 95 | 95 | 93 | 97 |
| Bleed-out | AUS308 | μm | 87 | 99 | 125 | 72 | 478 |
|  | AUS703 |  | 119 | 124 | 152 | 96 | 512 |

The results in Tables 1 to 4 show that the liquid resin composition for sealings according to the Examples are excellent in heat resistance and shortness of the length of bleed-out as compared with the liquid resin composition for sealing according to the Comparative Example. Accordingly, it is understood that the liquid resin composition for sealing according to this embodiment can suppress the occurrence of the bleed-out phenomenon while maintaining high heat resistance.

All Documents, Patent Applications, and technical standards described herein are incorporated by reference herein to the same extent as if each of the Documents, Patent Applications, and technical standards had been specifically and individually indicated to be incorporated by reference.

The invention claimed is:
1. A liquid resin composition for sealing, comprising:
   an epoxy resin (A) having an epoxy equivalent weight of from 80 g/eq to 250 g/eq;
   a curing agent (B) containing at least one amino group in a molecule;
   a polymer resin (C) comprising at least one selected from the group consisting of a phenol resin, a phenoxy resin having an epoxy equivalent weight of 3,000 g/eq or more and a polyvinyl alcohol; and an inorganic filler (D),
wherein the polymer resin (C) has a weight average molecular weight of 10,000 or more,
wherein a content of the polymer resin (C) is from 0.05% by mass to 2.6% by mass with respect to a total solid content and a content of the inorganic filler (D) is from 46% by mass to 85% by mass with respect to the total solid content, wherein the total solid content is a residue obtained by removing a volatile component from the liquid resin composition for sealing, and
wherein the liquid resin composition for sealing has a viscosity from 11 Pa·s to 100.0 Pa·s at 25° C.

2. The liquid resin composition for sealing according to claim 1, wherein the polymer resin (C) has an SP (cal/cm$^3$)$^{0.5}$ value, determined by the Fedors method, of from 9.0 to 12.5.

3. The liquid resin composition for sealing according to claim 1, wherein the content of the polymer resin (C) is from 0.08% by mass to 2.6% by mass with respect to the total solid content.

4. The liquid resin composition for sealing according to claim 1, wherein the polymer resin (C) has a phenoxy structure.

5. The liquid resin composition for sealing according to claim 4, wherein the polymer resin (C) having the phenoxy structure comprises a bisphenol A epoxy resin, a bisphenol F epoxy resin, or a copolymerized epoxy resin of bisphenol A and bisphenol F, which has an epoxy equivalent weight of 3,000 g/eq or more.

6. An electronic component device, comprising:
a substrate having a circuit layer;
an element which is disposed on the substrate and electrically connected to the circuit layer; and
a cured product of the liquid resin composition for sealing according to claim 1, which is filled into a gap between the substrate and the element.

7. The liquid resin composition for sealing according to claim 1, wherein the polymer resin (C) further comprises a methacrylic acid polymer.

8. The liquid resin composition for sealing according to claim 1, wherein the polymer resin (C) does not include a methacrylic acid polymer.

9. The liquid resin composition for sealing according to 1, wherein the liquid resin composition for sealing has a viscosity from 11 Pa·s to 50.0 Pa·s at 25° C.

10. The liquid resin composition for sealing according to 1, wherein the polymer resin (C) comprises at least one selected from the group consisting of a phenol resin, and a polyvinyl alcohol.

11. A liquid resin composition for sealing, comprising:
an epoxy resin (A) having an epoxy equivalent weight of from 80 g/eq to 250 g/eq;
a curing agent (B) containing at least one amino group in a molecule;
a polymer resin (C) comprising at least one selected from the group consisting of a phenol resin, a phenoxy resin having an epoxy equivalent weight of 3,000 g/eq or more and a polyvinyl alcohol; and
an inorganic filler (D),
wherein the polymer resin (C) has an SP (cal/cm$^3$)$^{0.5}$ value, determined by the Fedors method, of from 9.0 to 12.5,
a content of the polymer resin (C) is from 0.05% by mass to 2.6% by mass with respect to a total solid content and a content of the inorganic filler (D) is from 46% by mass to 85% by mass with respect to the total solid content, wherein the total solid content is a residue obtained by removing a volatile component from the liquid resin composition for sealing, and
wherein the liquid resin composition for sealing has a viscosity from 11 Pa·s to 100.0 Pa·s at 25° C.

12. The liquid resin composition for sealing according to claim 11, wherein the content of the polymer resin (C) is from 0.08% by mass to 2.6% by mass with respect to the total solid content.

13. The liquid resin composition for sealing according to 11, wherein the polymer resin (C) has a phenoxy structure.

14. The liquid resin composition for sealing according to claim 13, wherein the polymer resin (C) having the phenoxy structure comprises a bisphenol A epoxy resin, a bisphenol F epoxy resin, or a copolymerized epoxy resin of bisphenol A and bisphenol F.

15. The liquid resin composition for sealing according to claim 11, wherein the polymer resin (C) further comprises a methacrylic acid polymer.

16. The liquid resin composition for sealing according to claim 11, wherein the polymer resin (C) does not include a methacrylic acid polymer.

17. The liquid resin composition for sealing according to 10, wherein the liquid resin composition for sealing has a viscosity from 11 Pa·s to 50.0 Pa·s at 25° C.

18. The liquid resin composition for sealing according to 10, wherein the polymer resin (C) comprises at least one selected from the group consisting of a phenol resin, and a polyvinyl alcohol.

19. A liquid resin composition for sealing, comprising:
an epoxy resin (A) having an epoxy equivalent weight of from 80 g/eq to 250 g/eq;
a curing agent (B) containing at least one amino group in a molecule;
a polymer resin (C) comprising at least one selected from the group consisting of a polyester, a phenol resin, a phenoxy resin having an epoxy equivalent weight of 3,000 g/eq or more and a polyvinyl alcohol; and
an inorganic filler (D),
wherein the polymer resin (C) has a weight average molecular weight of 20,000 or more,
wherein the content of the polymer resin (C) is from 0.05% by mass to 2.6% by mass with respect to a total solid content and a content of the inorganic filler (D) is from 46% by mass to 85% by mass with respect to the total solid content, wherein the total solid content is a residue obtained by removing a volatile component from the liquid resin composition for sealing, and
wherein the liquid resin composition for sealing has a viscosity from 11 Pa·s to 100.0 Pa·s at 25° C.

* * * * *